United States Patent [19]
Abe et al.

[11] Patent Number: 6,118,989
[45] Date of Patent: Sep. 12, 2000

[54] HIGH FREQUENCY VARIABLE GAIN AMPLIFIER DEVICE AND WIRELESS COMMUNICATIONS TERMINAL

[75] Inventors: Masayoshi Abe, Tokyo; Katsuyuki Oshiba, Kanagawa, both of Japan

[73] Assignee: Sony Corporation, Tokyo, Japan

[21] Appl. No.: 08/974,623

[22] Filed: Nov. 19, 1997

[30] Foreign Application Priority Data

Dec. 9, 1996 [JP] Japan ............................. P08-344644

[51] Int. Cl.[7] .............................. H04B 1/04; H01Q 11/12
[52] U.S. Cl. ......................... 455/127; 455/574; 330/51; 330/151
[58] Field of Search .................. 330/151, 51; 455/232.1, 455/233.1, 219, 246.1, 127, 572, 574

[56] References Cited

U.S. PATENT DOCUMENTS

| | | | |
|---|---|---|---|
| 5,060,294 | 10/1991 | Schwent et al. | 330/51 |
| 5,152,004 | 9/1992 | Väisänen et al. | 455/127 |
| 5,216,378 | 6/1993 | Einbinder et al. | 330/51 |
| 5,399,927 | 3/1995 | Gruber et al. | 330/51 |
| 5,661,434 | 8/1997 | Brozovich et al. | 330/51 |
| 5,831,477 | 11/1998 | Tsumura | 330/51 |
| 5,909,643 | 6/1999 | Aihara | 330/51 |

*Primary Examiner*—Edward F. Urban
*Assistant Examiner*—Rafael Perez-Gutierrez
*Attorney, Agent, or Firm*—Jay H. Maioli

[57] ABSTRACT

To obtain a more stable gain control range and to reduce power consumption with a smaller scale circuitry having simpler configuration for gain control, a high frequency variable gain amplifier includes multi stage transistor amplifiers, a change-over switch circuit for controlling supplying and interruption of a power supply voltage, and a field effect transistor switch circuit with grounded-gate connection inserted in a bypass path midway across an input terminal and an output terminal. The source of this field effect transistor switch is in direct current-connection to the drain of a field effect transistor of the final stage transistor amplifier circuit. When a power supply voltage is supplied to each of the transistor amplifiers via the change-over switch circuit, the field effect transistor switch is turned "off" and when the power supply voltage is interrupted, the field effect transistor switch is tuned "on".

5 Claims, 7 Drawing Sheets

HIGH FREQUENCY VARIABLE GAIN AMPLIFIER DEVICE AND WIRELESS COMMUNICATIONS TERMINAL

BACKGROUND OF THE INVENTION

The present invention relates to a high frequency variable gain amplifier device and a wireless communication terminal suited to use in, for example, cordless telephones and cellular telephones, etc.

With wireless communications terminals such as, for example, cellular telephones, when the distance to an opposing station is small, transmission power control is carried out with respect to the transmission in order to economize on transmission power usage, prevent saturation of high frequency amplifiers of an opposing station and reduce interference with other stations. In particular, in a Code Division Multiple Access (hereinafter referred to as "CDMA") method that is one cellular multi-connection method that has come to the forefront in recent times, highly precise transmission power control over a wide control band has been carried out to maintain line capacity.

On the other hand, at a receiver circuit, gain control is carried out in order to suppress fluctuations in the level of the received signal due to the influence of changes in the distance to an opposing station or faxing and to prevent saturation of the frequency controlled amplifier due to high level input signals.

An example will now be described with reference to FIG. 1 of the configuration of a cellular telephone taken as an example of a wireless receiving device.

Figure 1:
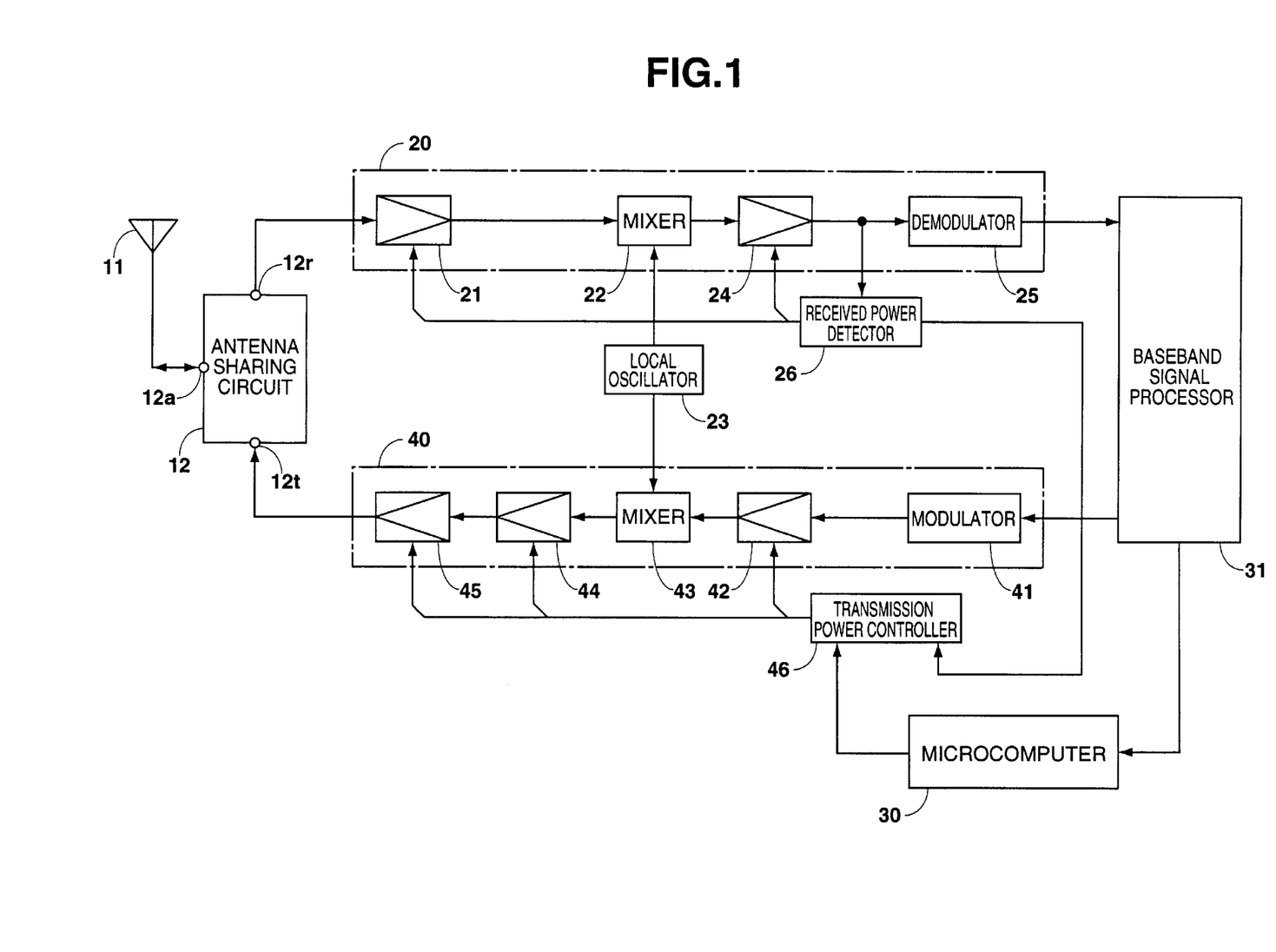
FIG. 1 is a block diagram showing a configuration of a related wireless communications terminal.

In FIG. 1, an antenna 11 for transmitting and receiving signals is connected to a port 12a of an antenna sharing circuit 12. This antenna sharing circuit 12 is equipped with transmission side and receiving side ports 12t and 12r, with bandpass filters (not shown in the drawings) of prescribed characteristics being connected across the antenna and transmission side ports 12a and 12t and the antenna side and receiving side ports 12a and 12r.

A high frequency signal from the receiving port 12r or the antenna sharing circuit 12 is supplied to a mixer 22 via a low noise high frequency amplifier 21 of a receiver 20. A local oscillating signal from a local oscillator 23 is supplied to the mixer 22. The high frequency signal from the low noise high frequency amplifier 21 is then converted to an intermediate frequency signal. This intermediate frequency signal is supplied to a demodulator 25 and a received power detector 26 via an intermediate frequency amplifier 24.

The output of the received power detector 26 is provided as negative feedback to the intermediate frequency amplifier 24 and the low noise high frequency amplifier 21 so that the gain of these circuits is automatically controlled. The output of the demodulator 25 is supplied to a baseband signal processor 31 where it undergoes prescribed signal processing, and the received information is played back as audio signals etc.

The played back received information includes information indicating the power of the transmission from, for example, a base station and this indication information is taken out by a microcomputer 30.

Transmitted information such as audio signals etc. is subjected to prescribed signal processing at the baseband signal processor 31 and an output signal of the baseband signal processor 31 is supplied to a modulator 41 of a transmitter 40. The output of the modulator 41 is supplied to a mixer 43 via an intermediate frequency amplifier 42.

A local oscillating signal from the local oscillator 23 is supplied to the mixer 43. The intermediate frequency signal from the intermediate frequency amplifier 42 is converted to a high frequency signal and supplied to the transmission port 12t of the antenna sharing circuit 12 via a driving amplifier 44 and a high frequency power amplifier 45.

A transmission power control signal from a transmission power controller 46 is supplied to the intermediate frequency amplifier 42, driving amplifier 44 and the high frequency power amplifier 45 so as to control the gain of these circuits. This transmission power control signal is generated based on received signal power detection information from the received power detector 26 and transmission power indication information from the microcomputer 30.

In the above, a configuration is described for transmission power control where control of direct current power supplied from a power supply to this high frequency power amplifier is exerted in response to transmission power control information in such a manner as to raise efficiency of the high frequency power amplifier at the time of low transmission output.

On the other hand, with the high frequency amplifier of this receiving circuit, the configuration also has to be such that the desired receiving characteristics are also obtained for high level input signals and the direct current power supplied from the power supply to this high frequency amplifier when the input signal is of a low level is therefore reduced by controlling this power in response to the level of the received signal.

Portable communication terminals generally continue in a waiting to receive state for long periods of time. If savings can be made in the current consumption of the high frequency amplifier of the receiving side for this period, substantial saving in the power consumed can be made because this usage tends to be for long periods even though this amount is small compared with the amount saved for the high frequency power amplifier of the transmission side.

With related high frequency variable gain amplifiers, drain current of either drain is reduced by, for example, controlling the gate bias voltage or drain bias voltage of field effect transistors comprising amplifiers in response to the input level (transmission power control information at the transmission and received signal level at the receiving circuit) of the amplifiers. The gain of the amplifiers is therefore made to change and the consumed power is reduced.

However, in the related technology it is necessary to adjust the control voltage value and range due to variations in the semiconductor process. It is therefore difficult to obtain large gain control widths that are stable.

In order to resolve these problems, in Japanese Patent Application No. Hei. 7-248697 (applied for on the Aug. 31, 1995) a variable gain amplifier capable of obtaining a stable large gain control width and capable of achieving reductions in the power consumed is provided having a plurality of transmission paths of different gains. One of these paths is switched over to and selected by a high frequency changeover switching and the power supplies for amplifiers for other transmission paths are turned off.

Figure 2:
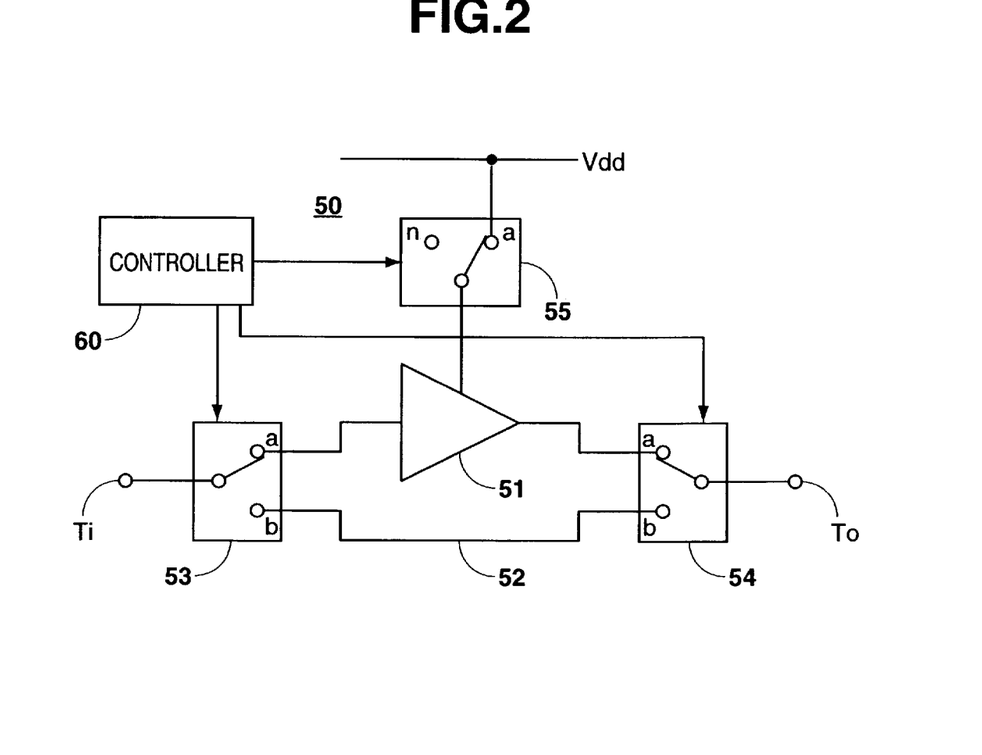
FIG. 2 is a block diagram showing a configuration of the previously disclosed high frequency variable gain amplifier device.

FIG. 2 shows an example of the variable gain amplifier disclosed above. At a variable gain amplifier 50 of this example, there is a transmission path including a high frequency amplifier 51 of a prescribed gain G51 taking, for example, field effect transistors (referred to as FETs in this specification) as active elements and a transmission path of a through line 52 of a gain of 0 dB. These two transmission paths are switched between by high frequency change-over switch circuits 53 and 54. A high frequency signal from the input terminal Ti is then taken from an output terminal To via one of the transmission paths in response to the change-over states of the high frequency change-over switch circuits 53 and 54.

Further, the power supply voltage Vdd of the high frequency amplifier 51 is supplied via a feed switch 55.

In the example provided, the high frequency change-over switch circuits 53 and 54 and the feed switch 55 are controlled so as to be operated together by a controller 60 in response to the transmission power control information or the received signal level described above. A high frequency signal is then supplied to the through line 52 and when the high frequency amplifier 51 is not operating, the feed to the high frequency amplifier 51 is halted by the feed switch 55 so that unnecessary power consumption by the high frequency amplifier 51 is avoided.

In this case, the controller 60 controls the timing of the high frequency change-over switch circuits 53, 54 and the feed switch 55 in such a manner as to avoid the output terminal To not having a signal. This is because it is not desirable for output terminal To to have no signal when high frequency change-over switch circuits 53 and 54 are changed over after first switching over the feed switch 55 to the side of terminal n when the transmission path of the through line 52 of a gain of 0 dB is changed over to.

Figure 3:
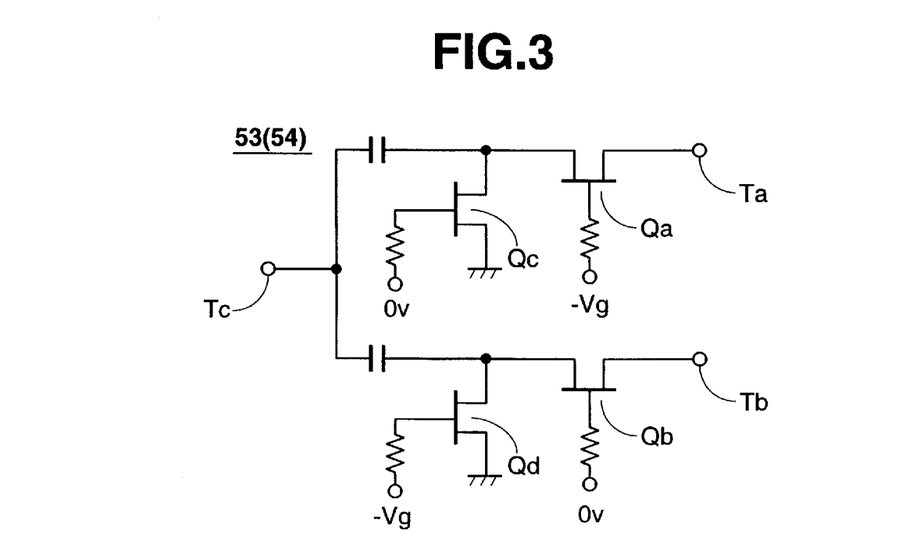
FIG. 3 is a circuit diagram showing the configuration of the high frequency change-over switch circuit of the previously disclosed example of FIG. 2.

The high frequency change-over switch circuits 53 and 54 in the example in FIG. 2 are each configured of four FETs of FET Qa to Qd, as shown in FIG. 3. Here, the source and drains of the first and second FETs Qa and Qb are inserted in series across a common terminal Tc and the first and second terminals Ta and Tb, respectively. The source and drains of the third and fourth FETs Qc and Qd are connected across the common terminal Tc and ground.

Then, for example, when a d.c. voltage [−Vg] for control use is supplied to the gates of FETs Qa and Qd and a d.c. voltage [0]V for control use is supplied to the gates of FET Qb and FET Qc, the first and third FETs Qa and Qc go "ON" and the second and fourth FETs Qb and Qd go "OFF" so that a signal transmission path is formed across the common terminal Tc and the second terminal Tb. Tc and the second terminal Tb.

Further, by making the control voltages supplied to the gates of each of the FETs Qa to Qd the opposite of that above, the "ON" and "OFF" states of the FETs Qa to Qd are inverted and a signal transmission path is formed across the common terminal Tc and the first terminal Ta.

In the example of FIG. 2, control of the timing of switching over the high frequency change-over switch circuits 53, 54 and the feed switch 55 is troublesome. Further, insertion loss occurs for the high frequency change-over switch circuits 53 and 54 (Ls53+Ls54) due to FET Qa and Qb of the FETs Qa to Qd comprising the high frequency change-over switch circuits 53 and 54 and there is therefore the problem that the gain G51 of the high frequency amplifier 51 is reduced by this portion.

Moreover, as the high frequency change-over switch circuits 53 and 54 are comprised of four FETs Qa to Qd, respectively, the scale of the circuit becomes large and the cost expensive, with this being a particular problem with regards to the strict demands of compactness at a low price placed on portable communications terminals.

In order to take into account the above problems, it is an object of the present invention to provide a high frequency variable gain amplifier device and wireless communications terminal having a scale of circuitry for gain control use that is small and being of simple construction that is capable of obtaining a remarkably stable range of gain control and capable of reducing power consumption.

SUMMARY OF THE INVENTION

In order to achieve the aforementioned object, according to the present invention, a high frequency variable gain amplifier device comprises a transistor amplifier and a bypass switch. The transistor amplifier is supplied with a high frequency signal. The bypass switch is inserted across and input terminal and an output terminal of the transistor amplifier and is for controlling forming of a bypass path. The bypass path is formed by the bypass switch in accordance with an input of a feed control signal designating cutting off of a power supply to the transistor amplifier means. The bypass path is disconnected by the bypass switch in accordance with an input of a feed control signal designating feeding of the power supply to the transistor amplifier.

A feed switch can be included within a power supply feeding path for feeding a power supply voltage to the transistor amplifier so that the bypass switch can be controlled according to an output of the feed switch.

Further, in order to achieve the aforementioned object, a high frequency variable gain amplifier device comprises a transistor amplifier, a feed switch, a bypass switch, a first switch controller and a second switch controller. The transistor amplifier is supplied with a high frequency signal. The feed switch is provided within a power supply feeding path for the transistor amplifier. The bypass switch is inserted across an input terminal and an output terminal of the transistor amplifier and is for controlling forming of a bypass path. The first switch controller is for controlling changing over operation of the feed switch and the second switch controller is for controlling changing over operation of the bypass switch. The feed switch and the bypass switch are controlled by the first and second switch controllers.

This high frequency variable gain amplifier device can further comprise matching circuits at the output side of the transistor amplifier, with a connection point with the output of the bypass switch being provided within the matching circuits.

The high frequency variable gain amplifier of the present invention described above can be provided on a transmission signal output side or a transmission signal receiving side of a wireless communications terminal. In the case of providing the high frequency variable gain amplifier of the present invention on the transmission signal receiving side of a wireless communications terminal, control of the changing over operation of the feed switch can be carried out in response to the level of a received signal.

In the present invention, switching between the transmission path and the bypass path in the transistor amplifier is carried out by on-off operations of both of the bypass switch provided midway the bypass path and the feed switch within the power supply feeding path to the transistor circuit. The bypass switch provided midway along the bypass path is not a select switch as used in the example shown in FIG. 2 and makes the configuration simple. The transistor amplifier has only the feed switch that controls the power supply thereto with neither of its input and output sides being provided with a switch. As a result, there occurs no insertion loss as in the example shown in FIG. 2.

Switching is carried out only by controlling the timing in switching over the bypass switch and the feed switch. This facilitates the timing control in controlling the switching.

DETAILED DESCRIPTION OF THE PREFERRED EMBODIMENTS

First Embodiment

The following is a description with reference to FIG. 4 to FIG. 8 of the embodiments of a high frequency variable gain amplifier device of the present. Here, an example is given of the case of a high frequency variable gain amplifier device that can be applied to the driving amplifiers 44 and the high frequency power amplifier 45 of the transmission side or the low noise high frequency amplifier 21 of the receiving side of the wireless communication terminal described above in FIG. 1.

Figure 4:
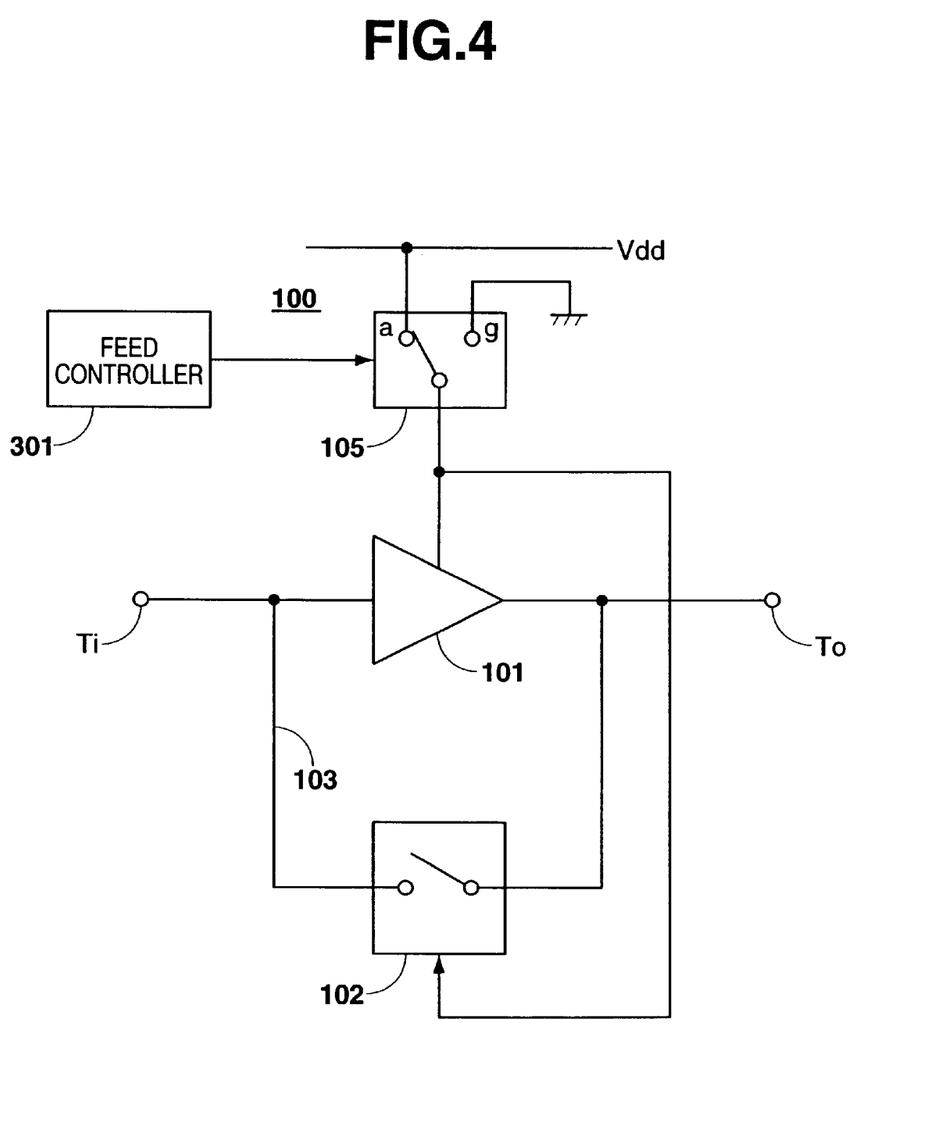
FIG. 4 is a block view of showing the basic configuration of the first embodiment of a high frequency variable gain amplifier device of the present invention.

The basic configuration of a first embodiment of the present invention is shown in FIG. 4.

In FIG. 4, a variable again amplifier 100 comprises a high frequency amplifier 101 and a high frequency switch circuit 102 for controlling the switching on an off of the signal bypass path for this high frequency amplifier 101.

The high frequency amplifier 101 taking, for example, FETs as active elements is connected across an input Terminal Ti and an output terminal To. A high frequency switch circuit 102 comprising, for example, FETs is then connected at the middle of a through line 103 connected across the input and output of the high frequency amplifier 101.

A change-over switch 105 comprising a feed switch that is comprised of , for example, a plurality of FETs is connected across a line from which a power supply voltage Vdd is obtained and a power supply line for the high frequency amplifier 101. In this case, the side of an input terminal a of this change-over switch 105 is connected to the line from which the power supply voltage Vdd is obtained and the side of an input terminal g of the change-over switch 105 is connected to earth. The output terminal of the change-over switch 105 is connected to a change-over control terminal of the high frequency switch circuit 102.

The change-over switch 105 operates in response to the aforementioned transmission power control information or received signal level and is controlled by a feed controller 301.

Under the control of the feed controller 301, as shown in FIG. 4, when the change-over switch 105 is connected to the side of input terminal a, the power supply voltage Vdd is supplied to the high frequency amplifier 101 via the change-over switch 105 and the high frequency amplifier 101 goes into an operating state.

At the same time, the power supply voltage Vdd passing through the change-over switch 105 is supplied to the high frequency switch circuit 102 as a control signal and the high frequency switch circuit 102 goes off. The connection across the input terminal Ti and the output terminal To that passes via the through line 103 is therefore opened.

In this state, the level of the high frequency signal output occurring at the output terminal To becomes higher than the level of the inputted high frequency signal occurring at the input terminal Ti by a gain G101 of the high frequency amplifier 101.

On the other hand, when the change-over switch 105 is changed over to a state that is the reverse of that shown in FIG. 4, the supply of the power supply voltage Vdd is cut, the operation of the high frequency amplifier 101 is halted, the earth potential passing through the change-over switch 105 is supplied as a control signal, the high frequency switch circuit 102 goes on, and the input terminal Ti and output terminal To are connected via the through line 103.

In this state, the level of the high frequency output occurring at the output terminal To is lower than the level in the high frequency signal input occurring at the input terminal Ti by a loss Ls that is the sum of the insertion loss of the high frequency switch circuit 102 and the mismatching loss occurring at the input terminal Ti.

The gain control width of the variable gain amplifier 100 therefore becomes G101+|Ls102| due to the changing over of the change-over switch 105 and the gain G101 of the high frequency amplifier 101 therefore becomes wider.

In this first embodiment, control is exerted so that the high frequency switch circuit 102 turns the signal bypass path on and off in response to the changing over to the change-over switch 105 for feed control use for the high frequency amplifier 101. Therefore, when functioning of the high frequency amplifier 101 is halted, the feed to the high frequency amplifier 101 is halted. Wasteful power consumption is therefore avoided and gain control range can be dramatically stabilized.

The high frequency switch circuit 102 of this first embodiment, as is described in the following, can have a simple configuration of a single FET or a plurality of FETs connected in series. The scale and cost can therefore be substantially reduced from that of the high frequency change-over switch circuits 53 and 54 of that previously put forward shown in FIG. 3.

Figure 5:
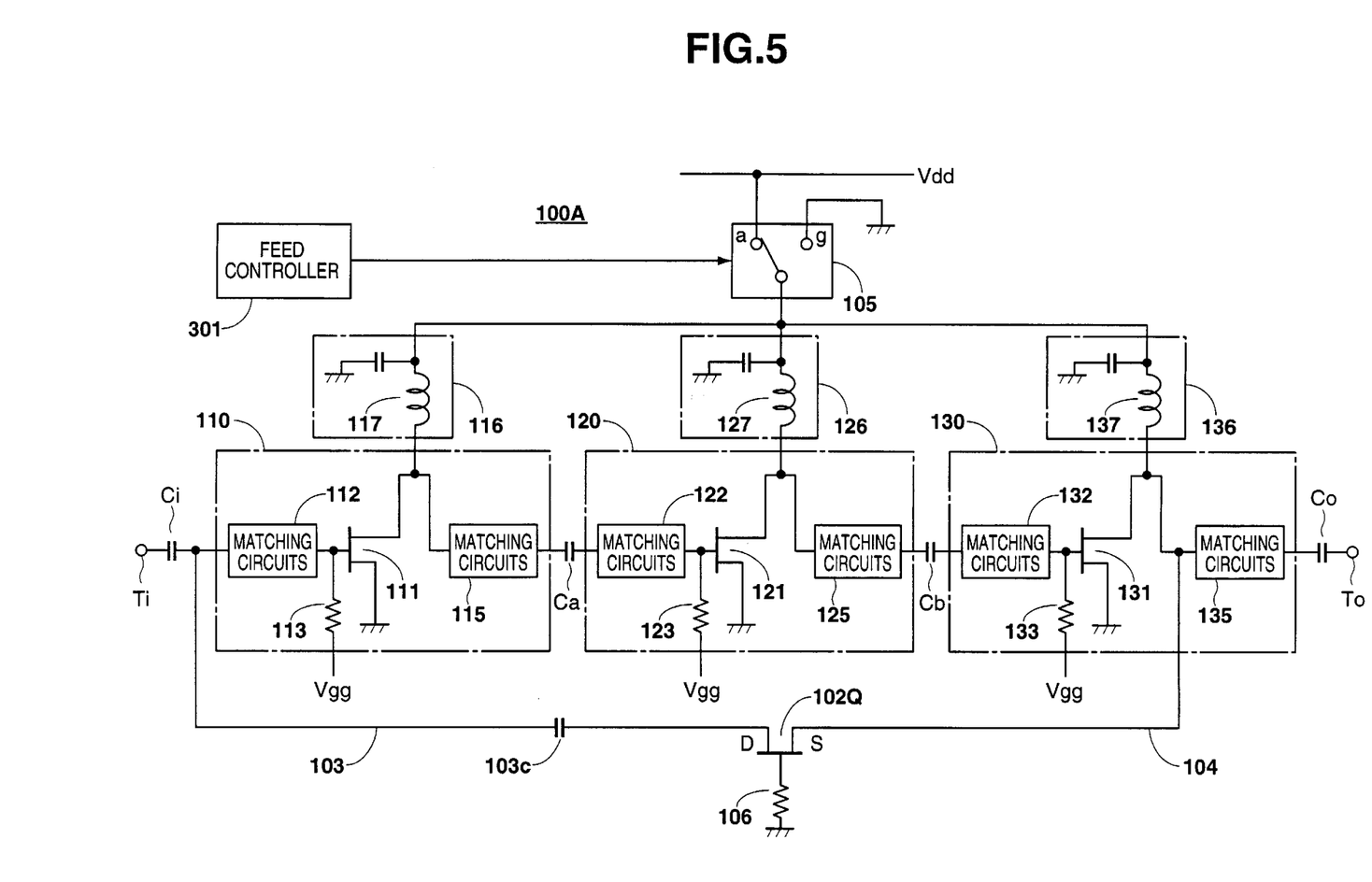
FIG. 5 is a circuit diagram showing the specific configuration of the first embodiment of the present invention.

A specific configuration of this first embodiment of the present invention is shown in FIG. 5. In FIG. 5, portions corresponding to portions of FIG. 4 are given the same numerals.

In FIG. 5, a variable gain amplifier 100A comprises three stages of unit amplifiers 110, 120 and 130 and an FET 102Q taken as a high frequency switch circuit for controlling the putting on and off of a signal bypass path for the unit amplifiers 110 to 130.

Capacitors Ci, Ca, Cb and Co and unit amplifiers 110, 120 and 130 are connected alternately one after another. Each of the unit amplifiers 110, 120 and 130 include FETs 111, 121 and 131, respectively, with the sources of each of these FETs being connected to earth and each unit amplifier being of the same configuration.

A high frequency signal from the input terminal Ti is supplied to the gate of FET 111 of the first unit amplifier 110 via the input side matching circuit 112 and capacitor Ci and a prescribed gate bias voltage Vgg is supplied via a resistor 113.

The drain of FET 111 is connected to matching circuit 115 and change-over switch 105 via a high frequency choke coil 117 of a drain bias supply circuit 116.

As described above, the side of the input terminal a of the change-over switch 105 is connected to the line for the power supply voltage Vdd and the side of the input terminal g is connected to ground. Change-over is then controlled by the feed controller 301 in response to transmission power control information or the level of the received signal.

A high frequency output of the unit amplifier 110 that is taken via the matching circuit 115 of the output side is supplied to a unit amplifier 120 of the following stage via a DC blocking capacitor Ca.

In the same way as for the first stage unit amplifier 110, a high frequency signal from the unit amplifier 110 is supplied to the gate of FET 121 of the unit amplifier 120 of the following stage via input side matching circuit 122 and DC blocking capacitor Ca, with a prescribed gate bias voltage Vgg being supplied via resistor 123.

The drain of FET 121 is connected to a matching circuit 125 and connected to the change-over switch 105 via a high frequency choke coil 127 of a drain bias supply circuit 126.

A high frequency output of the unit amplifier 120 taken via matching circuit 125 of the output side is supplied to a unit amplifier 130 of the final stage via a DC blocking capacitor Cb.

In the same way as for the unit amplifiers 110 and 120 of the first and following stages, a high frequency signal from the unit amplifier 120 is supplied to the gate of FET 131 of the final unit amplifier 130 via an input side matching circuit 132 and DC blocking capacitor Cb, with a prescribed gate bias voltage Vgg being supplied via a resistor 133.

The drain of FET 131 is connected to a matching circuit 135 and connected to the change-over switch 105 via a high frequency choke coil 137 of a drain bias supply circuit 136.

A high frequency output of the unit amplifier 130 from the matching circuit 135 of the output side is then taken at the output terminal To via the capacitor Co.

As described above, a depletion type FET 102Q is used as the high frequency switch circuit 102 of this first embodiment. The drain of this FET 102Q is connected to the input terminal Ti via a d.c. blocking capacitor 103c and the source of this FET 102Q is connected to the drain of the FET 131 of the unit amplifier 130 of the following stage. The gate of the FET 102Q is connected to ground via resistor 106.

The matching circuits 112 and 115 etc. are given appropriate publicly known configurations.

Resistors and capacitors (not shown in the drawings) connected in series are also connected at the drain bias supply circuit 116 so as to be in parallel with the high frequency choke coil 117 in order to prevent oscillations.

In FIG. 5, as resistors 113, 123, and 133 are provided with the purpose of providing isolation, sufficiently large inductors can also be used. Further, the high frequency choke coils 117, 127 and 137 can be replaced with a distributed constant line.

The following is a description of the operation of the first embodiment of FIG. 5.

When the change-over switch 105 is in the connection state shown in FIG. 5, drain bias voltage Vdd are supplied via the drain bias supply circuits 116, 126 and 136 under the control of the fee controller 301 and the unit amplifiers 110, 120 and 130 enter an operating state.

At the same time, the drain bias voltage Vdd is supplied to the source of the FET 102Q having its gate connected to earth through a resistor 106 and voltage [−Vdd] is applied across the gate and source of FET 102Q.

The pinch off voltage Vpf of this FET 102Q is given by:

$$V_{pf} > -V_{dd}$$

and with the change-over switch 105 in the connection state shown in the drawings, the drain/source channel of the FET 102Q is "off" and the connection across the input terminal Ti and the output terminal To via lines 103 and 104 becomes open.

In this state, the level of the high frequency signal of the output occurring at terminal To is higher than the level of the high frequency signal input occurring at terminal Ti by the total gain of the unit amplifiers 110, 120 and 130 of G110+G120+G130.

On the other hand, when the change-over switch 105 is changed over to the state opposite to that shown in the drawings, the supplying of the drain bias voltage Vdd is interrupted and the operation of the unit amplifiers 110 to 130 is halted.

At the same time, the source of FET 102Q is connected to ground via the change-over switch 105 and the high frequency choke coil 137 and a voltage of [0]V is applied across the gate and source of the FET 102Q. The drain/source junction of the FET 102Q therefore goes "on" and the input terminal Ti and output terminal To are connected via lines 103 and 104.

In this state, if the mismatching loss of the side of the input terminal Ti is ignored, the level of the high frequency signal of the output occurring at the output terminal To is lower than the level of the high frequency signal input occurring at the input terminal Ti by just the insertion loss Ls of the FET 102Q.

Therefore, by changing over the change-over switch 105, the gain control width of the variable gain amplifier 100A becomes G110+G120+G130+|Ls102Q|, which is broader than the total gain of the unit amplifiers 110, 120, and 130.

As described above, in this embodiment, the FET 102Q controls the tuning on and off of the signal bypassing in response to the changing over to the change-over switch 105 for supply control use with respect to the unit amplifiers 110 to 130. Therefore, when the functioning of the unit amplifiers 110 to 130 is halted, the feed to these unit amplifiers 110 to 130 is halted. Wasteful consumption of power is therefore avoided and gain control range can be dramatically stabilized.

The high frequency switch circuit 102 of this embodiment can have a simple configuration of single FET or a plurality of FETs connected in series. The scale and cost can therefore be substantially reduced from that of the high frequency change-over switch circuits 53 and 54 of that previously put forward shown in FIG. 3.

Further, as the FET 102Q taken as the bypass switch can be automatically put on and off so as to control changing over of the change-over switch 105 taken as the feed switch circuit, the complex change-over timing control of the switch of the example of FIG. 2 is no longer necessary.

Second Embodiment

Figure 6:
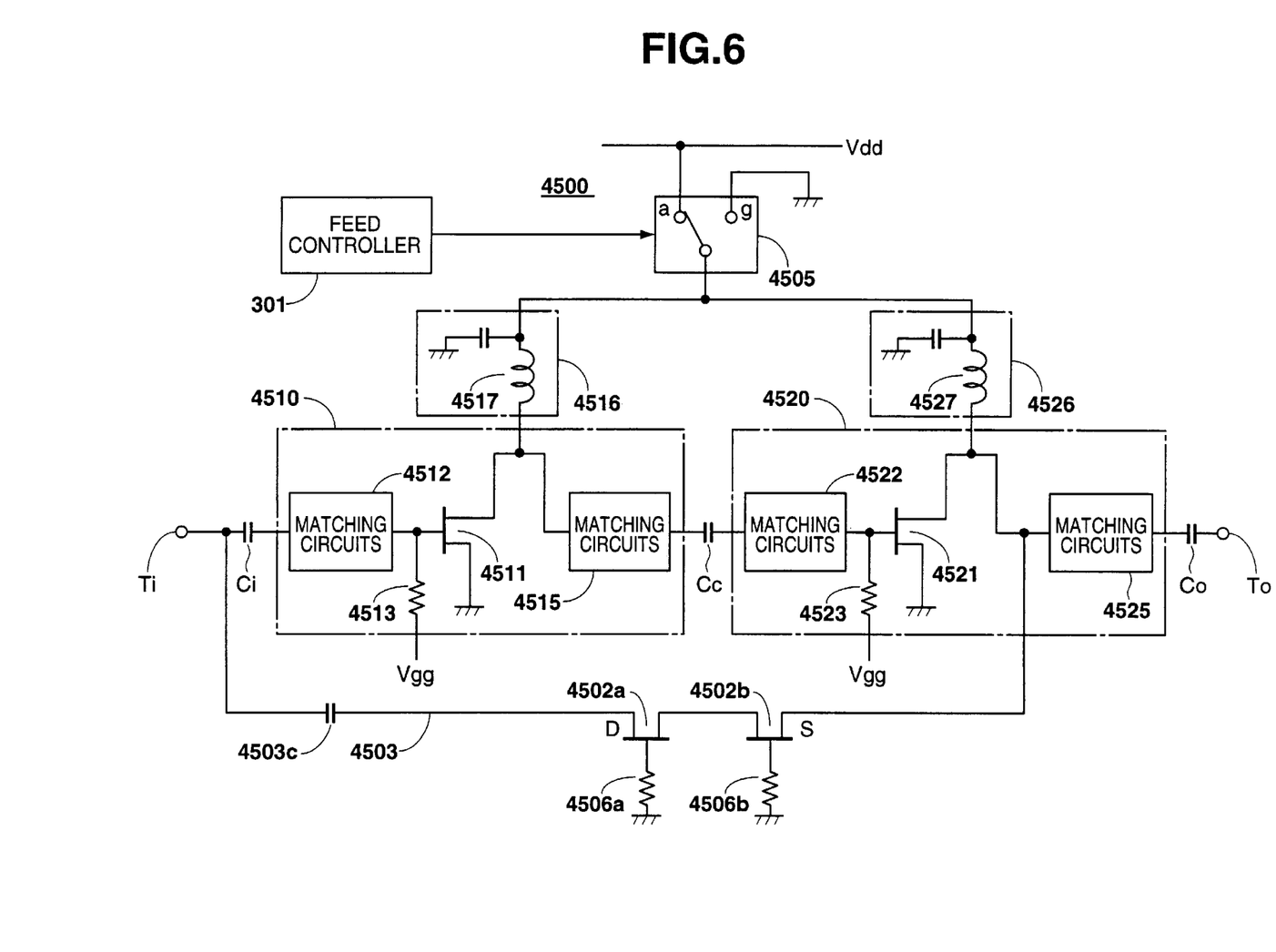
FIG. 6 is a circuit diagram showing the configuration of the second embodiment of the present invention.
Figure 7:
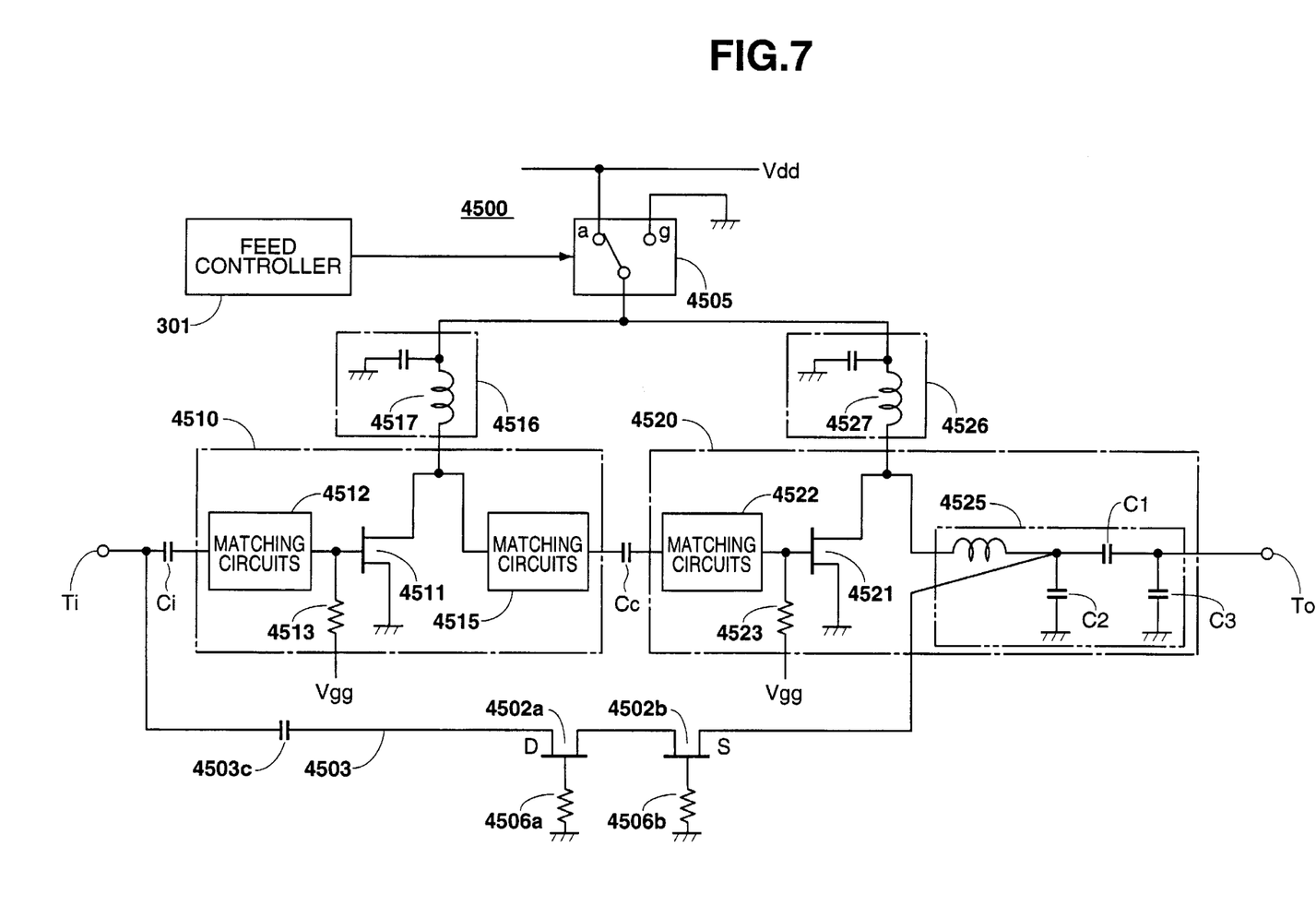
FIG. 7 is a circuit diagram showing a modified configuration of the second embodiment of the present invention.

Next, a description is given with reference to FIG. 6 and FIG. 7 of a second embodiment of the high frequency variable gain amplifier device of the present invention applied to a power amplifier of the aforementioned transmission circuit.

FIG. 6 shows a configuration of the second embodiment of the present invention. In FIG. 6, portions corresponding to those of FIG. 5 are given the same numerals or the same numerals for the last two digits.

In FIG. 6, a variable gain amplifier 4500 includes unit amplifiers 4510 and 4520 that provide two stages and two FETs 4502a and 4502b taken as high frequency switch circuits for controlling the turning on and off of signal bypassing to the unit amplifiers 4510 and 4520.

The unit amplifiers 4510 and 4520 include FETs 4511 and 4521, the sources of both of which are connected to earth and are of the same construction. The unit amplifiers 4510 and 4520 are connected alternately with capacitors Ci, Cc and Co one after another so as to be inserted across input terminal Ti and output terminal To.

A high frequency signal from the input terminal Ti is supplied to the gate of FET 4511 of the first unit amplifier 4510 via an input side matching circuit 4512 and capacitor Ci and a prescribed gate bias voltage Vgg is supplied via a resistor 4513.

The drain of FET 4511 is connected to matching circuit 4515 and is connected to change-over switch 4505 via a high frequency choke coil 4517 of a drain bias supply circuit 4516.

As in the previous embodiment, the side of an input terminal a of this change-over switch 4505 is connected to the power supply voltage line Vdd and the side of the input terminal g is connected to earth. Change-over control is then carried out by the feed controller 301 in response to the transmission power control information described previously.

A high frequency output of the unit amplifier 4510 taken via the matching circuit 4515 on the side of the output is supplied to the following stage unit amplifier 4520 via a junction capacitor Cc.

In the same way as for the unit amplifier 4510 of the first stage, a high frequency signal from the unit amplifier 4510 is supplied to the gate of FET 4521 of the unit amplifier 4520 of the following stage via a matching circuit 4522 and capacitor Cc of the input side, with a prescribed gate bias voltage Vgg being supplied via a resistor 4523.

The drain of FET 4521 is connected to a matching circuit 4525 and is connected to change-over switch 4505 via a high frequency choke coil 4527 of a drain bias supply circuit 4526.

A high frequency output of the unit amplifier 4520 taken via the matching circuit 4525 of the output side is taken from the output terminal To via the capacitor Co.

In the second embodiment of FIG. 6, with the two dispersion type FETs 4502a and 4502b taken as the high frequency bypass switch circuit, the source of FET 4502a and the drain of FET 4502b are connected in series and these transistors are then inserted in the middle of a through line 4503.

The drain of FET 4502a is then connected to the input terminal Ti via a d.c. blocking capacitor 4503c and the source of FET 4502b is connected to the drain of FET 4521 of the unit amplifier 4520. The gates of FET 4502a and 4502b are connected to ground via respective resistor 4506a and 4506b.

Various configurations can be adopted for the matching circuit 4525 for the output side of the unit amplifier 4520 of the final stage depending on the operating frequency and use etc., an example of which is shown in FIG. 7. In the example in FIG. 7, it is possible to provide a point of connection with the source of the FET 4502b at the matching circuit 4525 when the potential is equal to the drain potential.

By providing a connection point within the matching circuit 4525 in this way, it is possible to adjust the impedance viewed from the output terminal To when the FETs 4502a and 4502b of the frequency switch circuit are on. By then making adjustments to the most suitable impedance, fluctuations in the characteristics of circuits connected to the output terminal To due to load fluctuations can be suppressed.

In addition to describing the detailed configuration of the matching circuit 4525, FIG. 7 is exactly the same as FIG. 6 and the description of the remaining portions is therefore omitted.

Next, the operation of the second embodiment of FIG. 6 is described.

When the transmission output is made high based on the aforementioned transmission power control information, the change-over switch 4505 is put to the connection state shown in the drawings under the control of the feed controller 301, the drain bias voltage Vdd is supplied via the drain bias supply circuits 4516 and 4526 and both of the unit amplifiers 4510 and 4520 are put into operating states.

At the same time, the drain bias voltage Vdd of the unit amplifier 4520 is supplied to the source of FET 4502b, the gate of which is connected to earth. A voltage [−Vdd] is then applied across the gate/emitter of the FET 4502b.

The pinch off voltage Vpf of this FET 4502b is given by:
Vpf>−Vdd
and with the change-over switch 4505 connected in the state shown in the drawings the drain source junction of the FET 4502b goes "off", the drain source junction of the FET 4502a connected in series with this also goes "off", and the connection that goes across the input terminal Ti and the output terminal To via the d.c. blocking capacitor 4503c and through line 4503 is opened.

In this state, the level of the high frequency signal output occurring at the terminal To is higher than the level of the high frequency signal input occurring at the input terminal Ti by just the gain G4510+G4520 (dB) of both the unit amplifiers 4510 and 4520.

On the other hand, when the transmission output is lowered, the change-over switch 4505 is changed over to the opposite of the state shown in the drawings, supplying of the drain bias voltage Vdd is cut and the operation of both of the unit amplifiers 4510 and 4520 is halted.

At the same time, the source of the FET 4502b is connected to earth via the change-over switch 4505 and the high frequency choke coil 4527. The drain/source junction of the FET 4502b is then made to go "on" by applying a voltage of [0]V across the gate and source of this FET 4502b.

Together with this, the drain/source junction of the FET 4502b also goes on as a result of also applying a voltage of [0]V across the gate and drain of FET 4502a and a connection is made across the input terminal Ti and the output terminal To via lines 4503 and 4504.

In this state, if the mismatching loss of the side of the input terminal Ti is ignored, the level of the high frequency signal output occurring at the output terminal To is lower than the level of the high frequency signal input occurring at the terminal Ti by just the insertion loss Ls 4502a+Ls 4502b of FET 4502a and FET 4502b.

Therefore, by changing over the change-over switch 4505, the gain control width of the variable gain amplifier 4500 becomes G4510+F4520+|Ls4502a+Ls4502b|, with this being wider than the total gain G4510+G4520 of the unit amplifiers 4510 and 4520.

For example, a total gain of 25 dB is obtained in the case of a two stage unit amplifier at a frequency band of 2 GHz. Further, the loss for the signal path going via the two switch FETs of an "on" state is about 3 dB including mismatching loss at the input side.

As described above, in this second embodiment, FET 4502a and FET 4502b control the turning on and off of the signal bypass in response to the change-over of the change-over switch 4505 for feed control with respect to the unit amplifiers 4510 and 4520. Therefore, when the functioning of the unit amplifiers 4510 and 4520 is halted, feeding to these unit amplifiers 4510 and 4520 is halted. Unnecessary power consumption is therefore avoided and a much more stable gain control range is obtained.

In particular, as the handling power of the power amplifier of the transmission is large, power consumption can be reduced in an effective manner.

Further, the switch of this embodiment can have a simple configuration of the two FETs 4502a and 4502b connected in series. The scale and cost can therefore be substantially reduced from that of the high frequency change-over switch circuits 53 and 54 of that previously put forward shown in FIG. 3.

The high frequency switch of this embodiment is therefore two FETs 4502a and 4502b connected in series and the isolation of this switch when in an "off" state can therefore be made large.

Third Embodiment

A description will be given with reference to FIG. 8 of a third embodiment of the high frequency variable gain amplifier device of the present invention applied to an initial stage of an amplifier of a receiving device.

Figure 8:
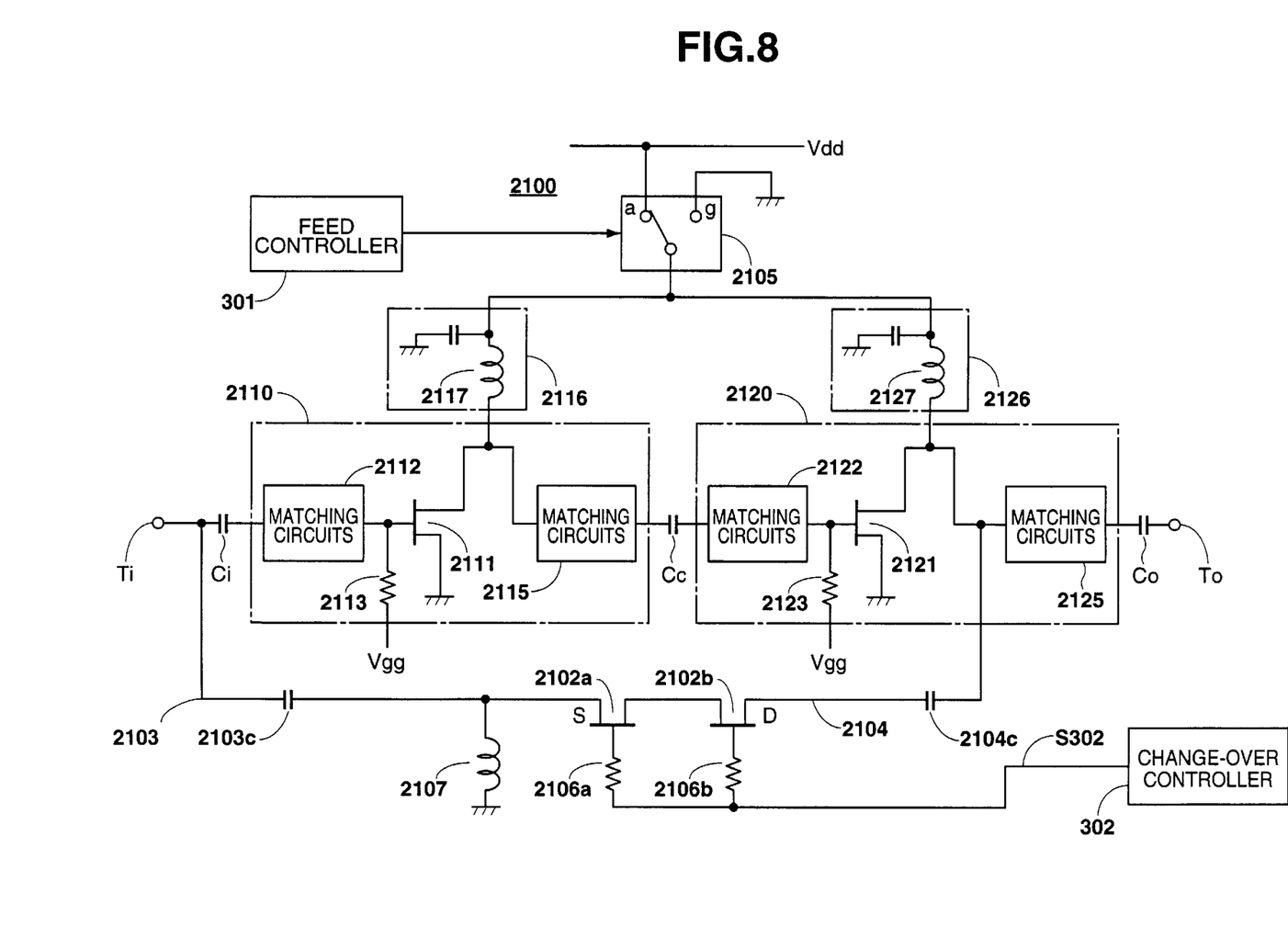
FIG. 8 is a circuit diagram showing the configuration of the third embodiment of the present invention.

FIG. 8 shows a configuration of the third embodiment of the present invention. In FIG. 8, portions corresponding to those of FIG. 5 are given the same numerals or the last two digits are made to be the same.

In FIG. 8, a variable gain amplifier 2100 includes two stages of unit amplifiers 2110 and 2120, and two FETs 2102a and 2102b taken as the high frequency bias switch for controlling the turning on and off of a line 2103 as a signal bypass path with respect to these unit amplifiers 2110 and 2120.

The unit amplifiers 2110 and 2120 include FETs 2111 and 2121, the sources of both of which are connected to earth and are of the same construction. The unit amplifiers 2110 and 2120 are connected alternately with capacitors Ci, Cc and Co one after another so as to be inserted across input terminal Ti and output terminal To.

A high frequency signal from the input terminal Ti is supplied to the gate of FET 2111 of the first unit amplifier 2110 via an input side matching circuit 2112 and capacitor Ci and a prescribed gate bias voltage Vgg is supplied via a resistor 2113.

The drain of FET 2111 is connected to matching circuit 2115 and is connected to change-over switch 2105 via a high frequency choke coil 2117 of a drain bias supply circuit 2116.

As for the previous embodiments, the side of an input terminal a of this change-over switch 2105 is connected to the power supply voltage line Vdd and the side of the input terminal g is connected to earth. Change-over control is then carried out by the feed controller 301 in response to the transmission power control information described previously.

A high frequency output of the unit amplifier 2110 taken via the matching circuit 2115 on the side of the output is supplied to the following stage unit amplifier 2120 via a junction capacitor Cc.

In the same way as for the unit amplifier 2110 of the first stage, a high frequency signal from the unit amplifier 2110 is supplied to the gate of FET 2121 of the unit amplifier 2120 of the following stage via a matching circuit 2122 and capacitor Cc of the input side, with a prescribed gate bias voltage Vgg being supplied via a resistor 2123.

The drain of FET 2121 is connected to a matching circuit 2125 and is connected to change-over switch 2105 via a high frequency choke coil 2127 of a drain bias supply circuit 2126.

A high frequency output of the unit amplifier 2120 taken via the matching circuit 2125 of the output side is taken from the output terminal To via the capacitor Co.

In this third embodiment, as with the embodiment of FIG. 6, with the two dispersion type FETs 2102a and 2102b taken as the high frequency bypass switch circuit, the source of FET 2102a and the drain of FET 2102b are connected together so as to be used in series.

In the third embodiment of FIG. 8, the source of FET 2102a is connected to the input terminal Ti via a d.c. blocking capacitor 2103c and connected to ground via a high frequency choke coil 2107. The drain of the remaining FET 2102b is then connected to the drain of the final stage unit amplifier 2120 via a d.c. blocking capacitor 2104c.

Further, in the third embodiment of FIG. 8, a prescribed control signal S302 from a change-over controller 302 is supplied to the gates of FET 2102a and FET 2102b that are in parallel via resistors 2106a and 2106b in response to the aforementioned received level.

By using the above configuration, with the third embodiment of FIG. 8 as for the second embodiment of FIG. 6, the connection end of the source of FET 2102a is by no means limited to portions supplied with the drain bias voltage Vdd such as, for example, the unit amplifier 2120 and can be selected within an appropriate scope. Further, the FETs 2102a and 2102b are by no means limited to the depression type of the case described in FIG. 6 and operation is also possible with an enhancement type.

The following is a description of the operation of the third embodiment of FIG. 8.

In this third embodiment, when the level of the received signal is low, the change-over switch 2105 goes into the connection state shown in the drawings under the control of the feed controller 301 and the d.c. level of the control signal S302 from the change-over controller 302 becomes lower [Vgg] than the pinch off voltage Vpf of the FET 2102a and FET 2102b.

Both of the unit amplifiers 2110 and 2120 are then supplied with the drain bias voltage Vdd via the change-over switch 2105 and the drain bias supply circuits 2116 and 2126 and therefore enter operating states.

The drain/source junction of the FET 2102a then goes "off", the drain/source junction of the FET 2102b connected in parallel with FET 2102a also goes off, and the connection across the input terminal Ti and the output terminal To via the d.c. blocking capacitor 2103c, through lines 2103 and 2104 and the d.c. blocking capacitor 2104c is then made to be open.

In this state, the level of the high frequency signal output occurring at the output terminal To is higher than the level of the high frequency signal input occurring at the input terminal Ti by the gains G2110+G2120 of both of the unit amplifiers 2110 and 2120.

On the other hand, when the level of the received signal is high, the change-over switch 2105 is changed over to the state that is the opposite of the state shown in the drawings and the d.c. level of the control signal S302 from the change-over controller 302 is changed over to the ground potential.

The supplying of the drain bias voltages is then shut off and both of the unit amplifiers 2110 and 2120 cases operation.

Further, the gate and sources become of the same potential to allow the "on" state between the drain and the source of the FET 2102a. In accompaniment with this, the gate and source of the FET 2102b connected in series with this FET become of the same potential to allow also the "on" state between the drain and the source of the FET 2102b. The input terminal Ti and the output terminal To are therefore connected via the d.c. blocking capacitor 2103c, through lines 2103 and 2104 and the d.c. blocking capacitor 2104c.

In this state, if the mismatching loss on the side of the input terminal Ti is ignored, the level of the high frequency signal output occurring at the terminal To is lower than the level of the high frequency signal input occurring at the terminal Ti by just the insertion loss Ls2102a+Ls2102b of the FET 2102a and the FET 2102b.

The gain control range of the variable gain amplifier 2100 due to the switching of the change-over switch 205 becomes G2110+G2120+|Ls2102a+Ls2102b|, which is wider than the total gain G2110+G2120 of the unit amplifiers 4510 and 4520.

As described above, FET 2102a and FET 2102b control the turning on and off of the signal bypass in response to change-over of the change-over switch 2105 for feed control use with respect to the unit amplifiers 2110 and 2120 under the control of the feed controller 301 and the change-over controller 302. When the functioning of the unit amplifiers 2110 and 2120 is halted, feeding to the unit amplifiers 2110 and 2120 is halted so that wasteful consumption of power is avoided and a markedly more stable gain control range is obtained.

The high frequency switch of this third embodiment has a simple configuration of the two FETs 2102a and 2102b connected in series. The scale and cost can therefore be substantially reduced from that of the high frequency change-over switch circuits 53 and 54 of that previously put forward shown in FIG. 3.

The high frequency switch of this third embodiment is therefore two FETs 2102a and 2102b connected in series and the isolation when in an "off" state can therefore be made sufficient.

In each of the above embodiments, FETs are used as both the active elements of the amplifiers and are used in the high frequency switch but the present invention is by no means limited in this respect and bipolar transistors can also be used.

As described above, according to the present invention, a stable gain control range can be obtained for each stage using a simple configuration; power consumption can be reduced and the scale of circuitry used in gain control can be reduced.

Control of the timing of the changing over of the feed switch and the bias switch is therefore no longer necessary and control is easier as a result.

What is claimed is:

1. A high frequency variable gain amplifier device comprising:

transistor amplifier means supplied at an input terminal with a high frequency signal;

bypass switch means formed of a field-effect transistor connected across said input terminal and an output terminal of said transistor amplifier means for controlling a connection of a bypass path; and feed switch means arranged in a power supply feeding path for connecting a power supply voltage at a power supply connection point to said transistor amplifier means, wherein a source electrode of said field-effect transistor is connected to said power supply connection point, so that said bypass switch means is controlled by an output of said feed switch means, wherein said bypass path is connected by said bypass switch means in response to a feed control signal shutting off a power supply to said transistor amplifier means, and said bypass path is disconnected by said bypass switch means in response to the feed control signal feeding the power supply to said transistor amplifier means.

2. The high frequency variable gain amplifier device of claim 1, further comprising matching means connected at the output terminal of said transistor amplifier means with a connection point of an output of said bypass switch means being provided within said matching means.

3. A wireless communications terminal having a high frequency variable gain amplifier device and producing a transmission signal, said high frequency variable gain amplifier device comprising:

transistor amplifier means supplied at an input terminal with a high frequency signal;

feed switch means connected within a power supply feeding path for supplying a voltage at a supply voltage connection in said transistor amplifier means;

a first field-effect transistor having a drain electrode connected to said input terminal and a source electrode connected to a drain electrode of a second field-effect transistor having a source electrode connected to said supply voltage connection at an output terminal of said transistor amplifier means for controlling connection of a bypass path;

first switch control means for controlling a changing over operation of said feed switch means; and second switch control means for controlling a connecting operation of said first and second field-effect transistors, wherein said feed switch means is controlled by said first switch control means and said first and second field-effect transistors are controlled by said second switch control means.

4. A wireless communication terminal having a high frequency variable gain amplifier device and producing a transmission signal, said high frequency variable gain amplifier device comprising:

transistor amplifier means supplied at an input terminal with a high frequency signal; and a field-effect transistor having a drain electrode connected to said input terminal and a source electrode connected to an output terminal of said transistor amplifier means for controlling connection of a bypass path, said bypass path being connected by said field-effect transistor in response to a feed control signal cutting off a power supply voltage connected to said output terminal of transistor amplifier means, and said bypass path being disconnected by said field-effect transistor in response to the feed control signal feeding the power supply to said transistor amplifier means.

5. The wireless communications terminal of claim 4, further comprising feed switch means connected in a power supply feeding path for feeding a power supply voltage to said transistor amplifier means at said output terminal, wherein said field-effect transistor is controlled by an output of said feed switch means.

* * * * *